United States Patent

[11] 3,632,438

[72] Inventors Harold G. Carlson Richardson; Clyde R. Fuller, Plano; George A. Brown, Richardson, all of Tex.

[21] Appl. No. 671,710
[22] Filed Sept. 29, 1967
[45] Patented Jan. 4, 1972
[73] Assignee Texas Instruments Incorporated Dallas, Tex.

[54] METHOD FOR INCREASING THE STABILITY OF SEMICONDUCTOR DEVICES
12 Claims, 23 Drawing Figs.

[52] U.S. Cl. .......... 117/215, 117/201, 117/DIG. 12, 156/17, 317/234 F
[51] Int. Cl. .......... C23c 13/04
[50] Field of Search .......... 117/200, 201, 215; 29/577, 578; 156/17; 148/187, 186; 317/234, 234 F

[56] References Cited

UNITED STATES PATENTS

| | | | |
|---|---|---|---|
| 3,410,736 | 11/1968 | Tokuyama et al. .......... | 148/186 |
| 3,503,813 | 3/1970 | Yamamoto .......... | 148/187 |

*Primary Examiner*—William L. Jarvis
*Attorneys*—Harold Levine, Melvin Sharp and John E. Vandigriff

ABSTRACT: Disclosed is a method of forming an insulating layer having an unusually low concentration of contaminating impurities such as sodium, copper, and iron on the surface of a semiconductor substrate during device fabrication. After the insulating layer has been grown or deposited on the surface of the substrate, a thin surface portion of the layer is removed by etching to a depth sufficient to remove a major portion of the impurities present in the layer. In one embodiment a glass film is formed on the surface of the layer by a reaction between an impurity modifier and the layer during processing of the device, to cause the impurities to concentrate in the glass film, and the glass film is removed, removing a major portion of the impurity contamination present in the layer. As a precaution against further contamination, a layer of barrier material is formed on the insulating layer.

HAROLD G. CARLSON
CLYDE R. FULLER
GEORGE A. BROWN
INVENTORS

BY James C. Fails
ATTORNEY

METHOD FOR INCREASING THE STABILITY OF SEMICONDUCTOR DEVICES

BACKGROUND OF THE INVENTION

1. Field of the Invention

This invention relates to semiconductor devices and more particularly to a passivation technique for planar semiconductor devices.

2. Description of the Prior Art

The conventional method of forming a planar device includes a step of passivating the exposed junctions on the surface of the semiconductor substrate with an insulating layer, such as silicon oxide. The initial insulating layer formed prior to the first diffusion is either maintained throughout the formation of subsequent, diffused regions in the substrate, and left on the finished device, or, alternatively, the initial insulating layer is removed after the final diffusion and a new insulating layer is formed with new apertures etched in the layer for contact formation. In either case, the layer remaining contains a high concentration of impurities that tend to cause device instability. Impurities that cause device instability are ordinarily metals, the atoms and ions of which migrate under an electromotive potential. Such metals include sodium, copper, iron and even gold. Sodium illustrates the worst behavior of the impurities. Therefore, the discussion hereinafter will emphasize sodium as illustrative of the problem and its solution.

The sodium contamination may have its origin in the chemical reactions and techniques of surface preparation used to form the insulating layer or the sodium may be physically or chemically absorbed from chance contamination. Ample opportunity for such contamination occurs in those operations used in semiconductor device manufacturing subsequent to each layer formation, such as contact application, contact definition by photolithographic and etching processes, scribing and breaking of the devices into individual elements, mounting of the individual devices, affixing leads and encapsulating the device in some type of protective container or coating. Such chance contamination arises from certain impurities present in the chemicals used in these processes, from airborne materials and from the operator's handling, e.g. breathing on or touching the device accidentally, or using contaminated vessels.

As noted, due to the mobility of sodium ions in an electric field in the silicon oxide used for passivating junctions, semiconductor devices with insulating layers having high sodium concentrations are subject to operating instability. Metal-oxide-semiconductor devices such as field-effect transistors are particularly susceptible to operating instability caused by sodium contamination of the gate dielectric. Incorporation of impurities in glasses and silica and the associated charge transfer in these media due to the thermal ionization of impurities from their bound state in potential wells and subsequent drift under the influence of an electric field have been widely discussed for bulk samples, for example, see A. E. Owen, *Progress in Ceramic Science*, Vol. III, MacMillan Company, New York (1963).

SUMMARY OF THE INVENTION

In accordance with the invention there is provided an improvement in the manufacture of planar semiconductor devices which affords a stable device. The improvement comprises (a) forming an insulating layer over the planar semiconductor device and (b) removing only a minor thickness including the surface of the insulating layer, but removing a major proportion of contaminating impurities, whereby only a residual concentration of impurities below a level that reduces stability of the planar semiconductor device remains in the insulating layer. We have found that the contaminating impurities in an insulating layer tend to concentrate near the surface of the layer and that only about 200 A. of the insulating layer need be removed to remove the major portion of the contaminating impurities. Specifically, only the first 200 A. thickness, measured from the surface, of the ordinary insulating layer contains a concentration of contaminating impurities above the level which induces instability effects into the semiconductor device.

Although the remaining thickness of the insulating layer may be employed as the sole passivating means where the minor thickness is removed at the last of the processing operations, it is preferable to remove the contaminants early in the manufacturing operations and to deposit onto the insulating layer a barrier layer. The barrier layer is a layer of materials which are impervious to migration of the contaminating impurities therethrough. A suitable barrier layer is formed by material such as silicon nitrides, alumina, or other materials defined hereinafter. The reasons why the layer of barrier materials are impervious to the impurities is not exactly understood at present.

A suitable thickness of the insulating layer is removed by either of two techniques. One technique is to physically or chemically remove the surface of the layer to a depth of approximately 200 A. An alternate technique is to form a glass by reaction of the impurity material used in the diffusion operation required to form the regions of a device with the insulating layer and to remove the glass.

FIGS. *6a–6f* are a series of sectional views illustrating the fabrication of a metal-oxide-semiconductor field-effect transistor (MOS-FET) during which a phosphosilicate glass is formed and removed from the surface of a silicon oxide layer.

FIGS. *7a–7d* are a series of sectional views illustrating an alternate fabrication technique beginning with the stage of fabrication as shown in FIG. *6c*.

FIGS. *8a–8f* are a series of sectional views illustrating the fabrication of a bipolar transistor.

FIGS. *9a–9b* are sectional views illustrating the use of a sodium-barrier layer in the fabrication of a bipolar transistor beginning with the stage of fabrication as shown in FIG. *8e*.

DESCRIPTION OF SPECIFIC EMBODIMENTS

The reason why the invention is successful in producing a stable semiconductor device can be seen from a detailed study of surface phenomena. The results of the detailed study is illustrated in the figures and is described hereinafter.

Figure 1:
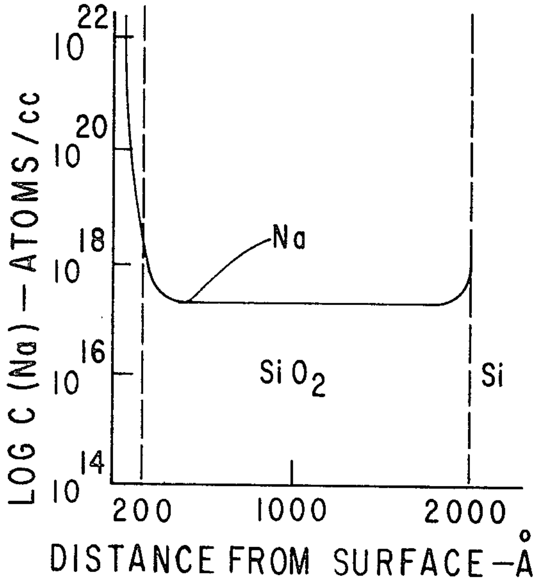
FIG. 1 is a graph illustrating sodium concentrations at different depths from the surface of a silicon oxide layer formed on a silicon substrate.

The reason the first technique, the removal of a surface portion of the insulating layer to a depth of 200 A., is successful is illustrated in FIG. 1. FIG. 1 is a graph showing the concentration of sodium in a conventionally formed silicon oxide layer 2,000 A. thick on a silicon substrate. The ordinate is in log concentration of sodium (Na) in atoms per cubic centimeter (cc.) while the abscissa is in distance in A. from the surface of the silicon oxide layer toward the surface of the silicon substrate. The greatest concentration of sodium atoms in the layer is in the portion lying within about the first 200 A. from the surface of the layer. Under this region the sodium concentration remains at an almost constant concentration of about $10^{17}$ atoms/cc. until the surface of the silicon substrate is reached. About the first 200 A. contains the major portion of any sodium present, regardless of thickness.

For example, in the data obtained and forming the basis for FIG. 1, about 99 percent of the total amount of sodium present in the silicon oxide layer occurred in the first 200 A. thickness. The remaining 90 percent of the silicon oxide layer contained less than 1 percent of the sodium contaminating the layer.

Concentrations below about $10^{17}$ atoms/cc. has little deleterious effect on device performance. Thus if, about the first 200 A. of the silicon oxide layer is removed, the major portion of the sodium present in the silicon oxide layer is also removed. We have found that devices having concentrations of sodium as low as illustrated in FIG. 1; e.g. below $10^{18}$ atoms per cc.; are stable.

Figure 2:
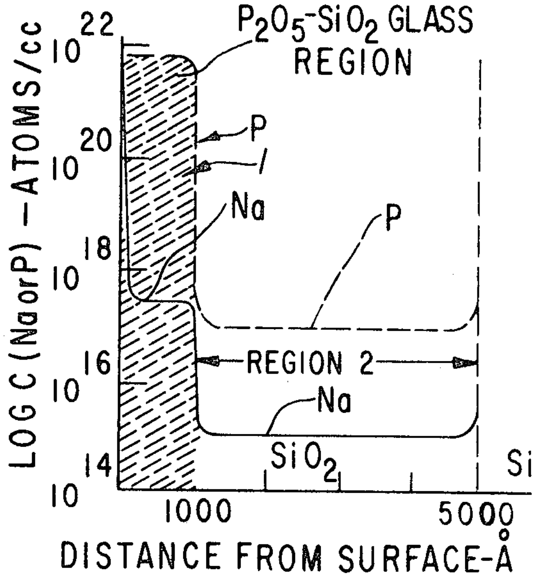
FIG. 2 is a graph illustrating phosphorus and sodium concentrations at different depths from the surface of a silicon oxide layer after the reaction of phosphorus with the surface of the layer to form a phosphosilicate glass.

The reason the alternate technique, forming a glass layer on the surface of the insulating layer and subsequently removing the glass layer, is successful as illustrated in FIG. 2. FIG. 2 shows the sodium and phosphorus concentration in a phosphosilicate glass and an underlying silicon oxide layer. Therein, the glass was formed by the reaction of phosphorus with the surface of a silicon oxide layer on a silicon substrate. The glass film illustrated is approximately 1,000 A. in thickness. The phosphosilicate glass, generally indicated by the dashed area 1, acts as a "getter" for sodium in the silicon oxide layer and causes the concentration of sodium in the remaining portion of the layer to be of a lower concentration than there would normally be without the glass. Thus, when the glass is removed, as by etching, the major portion of the sodium that was originally present in the oxide layer is removed. The phosphorus in the remaining silicon oxide layer, region 2 in FIG. 2, has no deleterious effect on the operation of the device.

Apparently, there is a threshold concentration below which the impurities do not form sufficient cations to cause electrical instability on subsequent use. Either of the techniques seem to reduce the concentration of impurities below this threshold level since they produce stable devices.

Figure 3:
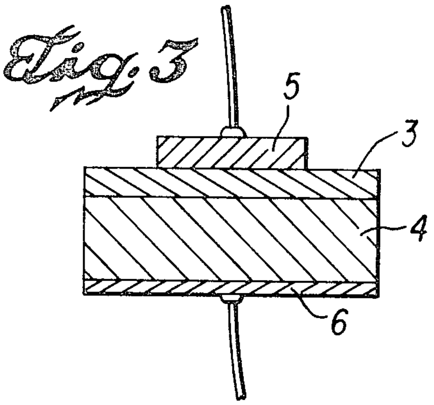
FIG. 3 is a section view of a metal-oxide-semiconductor (MOS) capacitor typical of the ones used to obtain the data for the graphs illustrated in FIGS. 4 and 5.
Figure 4:
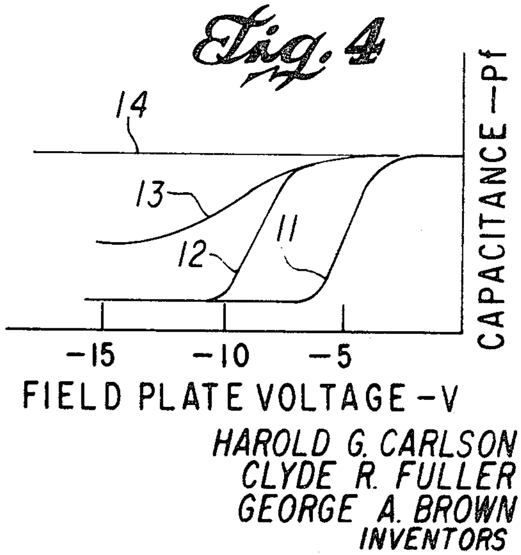
FIG. 4 is a graph of a series of curves at increasing test hours under load showing the capacitance versus voltage of a test device having a silicon oxide layer formed in the conventional manner.
Figure 5:
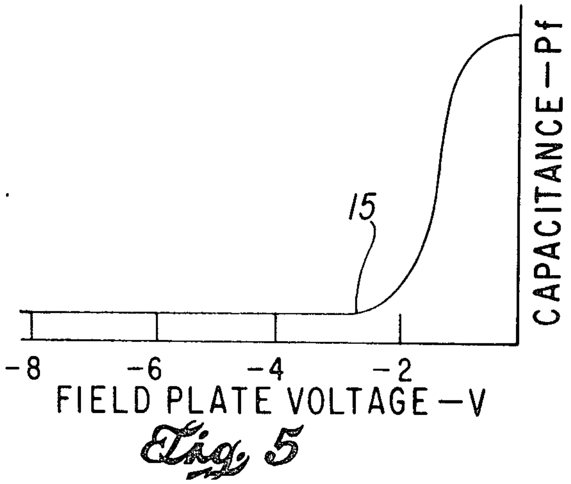
FIG. 5 is a graph of a series of curves at increasing test hours under load showing the capacitance versus voltage of a test device having a silicon oxide layer formed according to the invention.

A MOS capacitor of the type used to obtain the data for the curves in FIGS. 4 and 5 is shown in FIG. 3. A layer 3 of silicon oxide which acts as the dielectric for the capacitor is formed on one surface of a silicon substrate 4 which acts as one capacitor plate. A layer 6 of metal is formed on the opposite surface of the substrate 4 to allow good ohmic contact to the substrate 4. A layer 5 of metal is formed on the silicon oxide layer 3 to serve as the other capacitor plate.

The results of capacitance versus test voltage of a capacitor such as shown in FIG. 3, having a conventionally formed silicon oxide layer of approximately 2,000 A. in thickness after an increasing number of test hours at a stress voltage is shown in FIG. 4. A stress voltage of about $10^6$ volts per centimeter of layer thickness was applied to the test device with the capacitor plate 5 being held at a positive potential in relation to the capacitor plate 6. After each test period was completed, the capacitor was taken from a temperature-controlled furnace and allowed to return to room temperature with the stress voltage maintained. The stress voltage was removed and the capacitance was measured under an increasing test voltage (field plate voltage in FIGS. 4 and 5) of opposite polarity, resulting in the data shown in FIG. 4. The stress voltage was reapplied and the capacitor returned to the furnace for further testing. Curve 11 shows the data taken prior to any temperature stress and before the stress voltage had been applied. Curve 12 shows the data taken after the test sample had been held at 120° C. for 5 minutes under the stress voltage. The data for curves 13 and 14 was generated by the same procedure as used to obtain the curve 12 except that the data for curve 13 was obtained after 30 minutes at 125° C. and the data for curve 14 was obtained after 60 minutes at 125° C. The sodium contamination in the conventionally formed silicon oxide layer caused the test data to vary in relationship to the time at the stress temperature and stress voltage.

A test device with a silicon oxide layer of about 1,050 A. in thickness formed after removing about 200 A. of the surface of the layer according to the invention is shown in FIG. 5. Curve 15, drawn from data obtained in the manner as explained in conjunction with FIG. 4, is in reality two curves which are within 0.1 volts. The first curve was from data generated prior to any temperature or voltage stressing while the second curve was obtained from the data taken after 1,000 minutes at 300° C., under $10^6$ v./cm. of oxide thickness. The removal of the high sodium concentration portion of the silicon oxide layer left the remaining layer sufficiently low in sodium for there to be no shift in voltage under temperature and voltage stressing due to the remaining sodium. FIG. 5 thus illustrates that extremely stable devices are obtained by use of this invention.

In one embodiment of the invention, a MOS-FET is fabricated as shown in FIGS. *6a–6f*. Substrate 22, as shown in FIG. *6a*, will usually be a part of a large slice of semiconductor material; such as P-type silicon; comprising a large number of substrates similar to substrate 22. Following the completion of component fabrication, each substrate may be separated or remain as a part of the slice to have components of one substrate interconnected with components of other substrates.

An insulating layer 21, of silicon oxide, is formed on substrate 22 by conventional methods, such as by the low-temperature pyrolitic deposition method or by the higher temperature thermal growth of silicon oxide from the silicon substrate itself when the substrate is heated to a temperature of about 1,100° C. in a steam or dry air atmosphere. The surface of the silicon oxide layer 21 is covered with a photoresistive material such as KMER, manufactured by Eastman Kodak, Rochester, N.Y. The surface of the KMER is exposed to a pattern of light such that only the portion of the KMER that is required to protect portions of the oxide from a subsequent etching operation is exposed to light. The KMER polymerizes only in those regions exposed to the light. The KMER is subjected to a developer, such as trichloroethylene, that dissolves the unpolymerized KMER, thereby exposing portions of the underlying layer 21. The KMER and the exposed portions of the layer surface are subjected to an etching condition for a period of time sufficient to form the apertures 23 in the layer 21 as shown in FIG. 6 *b*. The etching condition is ordinarily a solution of hydrofluoric acid buffered with ammonium bifluoride. The remaining KMER is then removed.

Next, substrate 22, covered in part by silicon oxide film 21, is placed in a diffusion furnace with an atmosphere of phosphorus oxide for the twofold purpose of (1) forming a phosphosilicate glass to concentrate the impurities like sodium in the surface glass layer and (2) to diffuse phosphorus as a doping agent into the silicon substrate exposed by apertures 23. The phosphorus oxide atmosphere is formed from a reaction of phosphorusoxychloride ($POCl_3$) with oxygen. The temperature in the diffusion furnace is high enough to react the phosphorus oxide with the silicon oxide layer and with the portion of the silicon substrate exposed by apertures 23, but low enough to cause very little diffusion of the phosphorus into the silicon oxide 21. As an example, 200–400 cc. per minute of nitrogen bubbled through phosphorusoxychloride and 50 cc. per minute of oxygen in a stream of about 1,600 cc. per minute of dry nitrogen form a typical phosphorus deposition atmosphere for use at a temperature of from 700° to 900° C. The reaction times range from about 60 minutes at almost 700° C. down to about 5 minutes at about 900° C. A thin film 20*a* of phosphosilicate glass is formed on the surface of the silicon oxide layer 21 and a phosphorus glaze 20*b* is formed on the portions of the surface of the substrate 22 exposed by aperture 23. The phosphorus diffuses into the substrate to some extent, forming the diffused regions 24*a* and 25*a* as shown in FIG. *6c*.

The phosphosilicate glass acts as a "getter" for impurities like sodium and causes that portion of the silicon oxide layer 21 which reacts with the phosphorus to form the glass film 20*a* to contain a higher concentration of impurities than would normally be present without the glass formation. The penetration of the phosphosilicate glass film 20*a* is precisely predicted from the temperature, time of reaction, and concentration of phosphorus in the atmosphere used for the diffusion operation. To illustrate, in the example given above employing 200–400 cc. per minute of nitrogen bubbled through phosphorusoxychloride, the relationship between the depth of diffusion X, in centimeters (cm.), the temperature T in degrees Kelvin, and the time of reaction *t* in seconds (sec.), is given by the following equation:

$$X^2/t=1.6\times10^{-6}\exp(-1.66/KT)\text{ cm.}^2/\text{sec.}$$

where $K$ is the Boltzmann constant in units of electron volts/degreees Kelvin, approximately $0.861\times10^{-4}$.

The reaction time at a given temperature and concentration of phosphorus oxide is controlled to form a known thickness of phosphosilicate glass and leave a desired thickness of unglassed, silicon oxide having a low concentration of impurities after removal of the glass film. Next the substrate is removed from the furnace and the glass film 20*a* and the glaze film 20*b* are removed by chemical etching. The rapid etch rate of the glass, compared to the underlying silicon oxide, facilitates accurately controlling the removal of the glass and leaving the desired thickness of silicon oxide containing the low concentration of impurities therein.

Care must be exercised in the etching and subsequent operations to insure that the layer of silicon oxide does not become recontaminated. As previously indicated, it is preferred to deposit a layer of barrier material to prevent recontamination.

Figure 6A:
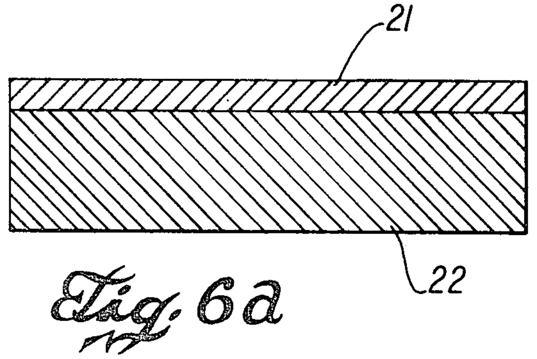
Figure 6B:
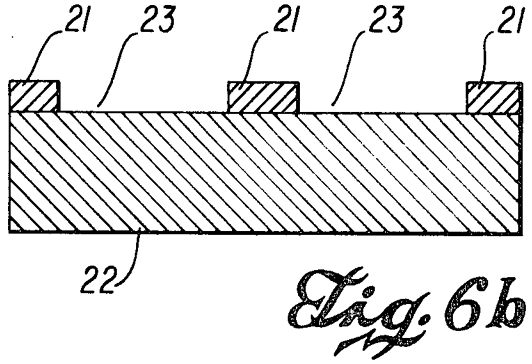
Figure 6C:
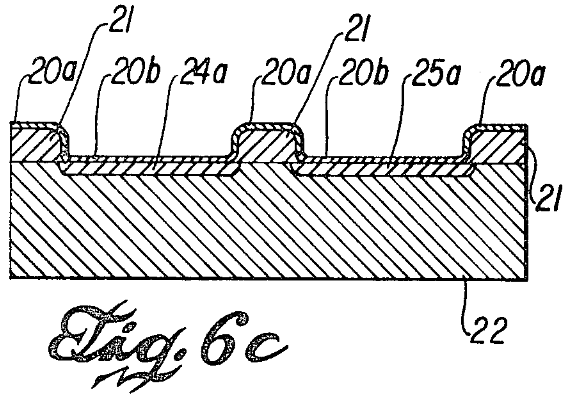
Figure 6D:
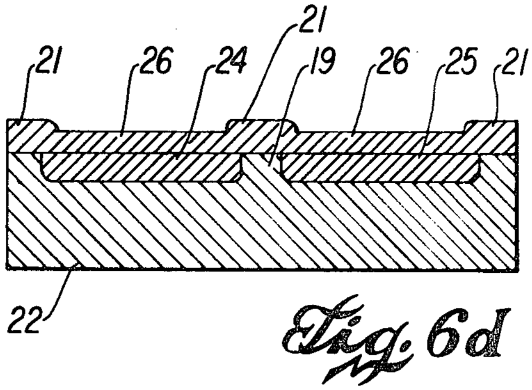

The substrate 22 is placed in another furnace at a temperature of approximately 1,000° C., also in an oxidizing atmosphere, for a period of time sufficient to diffuse the phosphorus further into the substrate to form the source and drain regions 24 and 25, respectively, which in the illustration given, are N-type as shown in FIG. 6*d*. An oxide layer 26 is grown on the exposed portions of the silicon substrate during the diffusion operation.

Figure 6E:
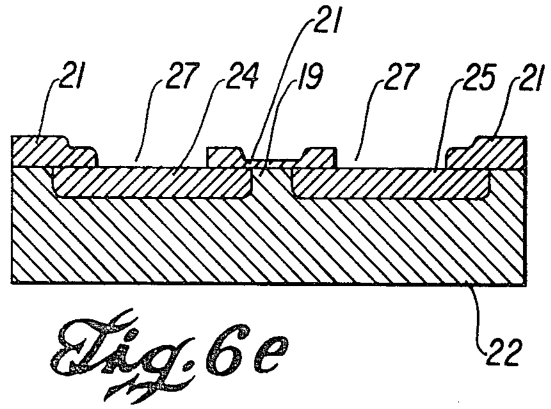

Apertures 27 are formed in the oxide layer 26 over the source region 24 and drain region 25, as shown in FIG. 6*e*, using the photolithographic techniques as previously described. If the portion of the oxide layer 21 which lies on the surface of the substrate 22 over the gate 19 is too thick, that portion of the layer is etched further until the desired thickness is obtained.

Figure 6F:
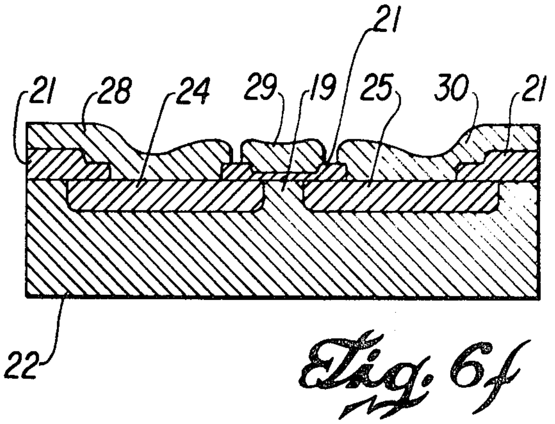

The source metal contact 28, the metal gate electrode 29 and the metal drain current 30 are formed to complete the MOS-FET, as shown in FIG. 6*f*.

Although the foregoing embodiment has been described with reference to forming phosphosilicate glass, any glass which will effect a concentration of the impurities in the glass layer may be employed to obtain a similar result. For example, a borosilicate glass may be formed on semiconductor devices, particularly when boron is to be used as a dopant impurity. Removal of the glass layer then leaves the underlying silicon oxide having a low concentration of impurities and effects a stable, high-performance device.

Figure 7A:
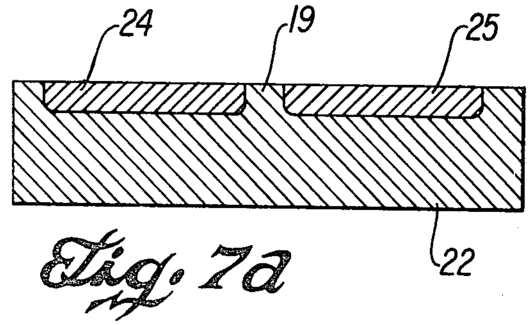
Figure 7B:
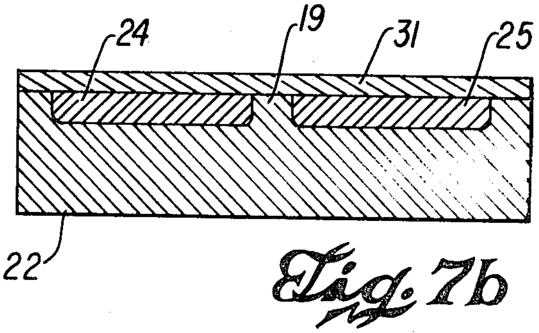

Another embodiment of the invention is illustrated in FIGS. 7*a*–7*d*. The diffused source region 24 and drain region 25 are formed by the method as described in conjunction with FIGS. 6*a*–6*d*. After the diffusion operation is completed, the entire surface of the substrate 22 is exposed by removing all the oxide and glass formed in prior operations by chemical etching, as shown in FIG. 7*a*. A new silicon oxide layer 31 is formed on the entire surface of the substrate 22, as shown in FIG. 7*b*.

Figure 7C:
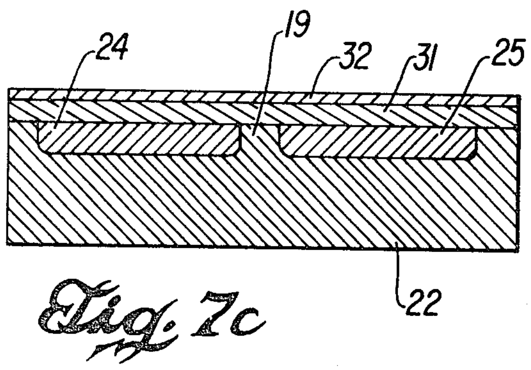

To remove a substantial portion of the sodium contamination present in the silicon oxide layer 31, a portion of the layer 31 is removed to a depth sufficient to remove much of the sodium present. As previously explained, only about 200 A. in thickness need be removed but a greater depth can be removed, if so desired. In certain devices, the metal contacts to the regions of the devices can be formed directly on the surface of the layer 31 resulting after removal of the highly contaminated surface portion of the layer. In other devices, there is formed a barrier layer 32 of a material, such as silicon nitride, aluminum oxide or phosphorus-doped deposited silicon oxide. Other organic or inorganic materials such as calcium-doped silicon oxide, that prevent penetration and diffusion of sodium through the barrier layer can be employed as the barrier layer. The barrier layer is deposited by methods appropriate to the particular type layer used, on the surface of the silicon oxide layer 31, as shown in FIG. 7*c* to form an insulating coating which is low in impurities and which prevents further contamination by impurities such as sodium.

By conventional photolithographic techniques, apertures 33 are formed in both the layers 31 and 32. To etch the barrier layer more rapidly when silicon nitride is used, phosphoric acid at 180° C. is employed as the etch solution. A reflux condenser and heater maintain the concentration relatively constant during the etching.

Figure 7D:
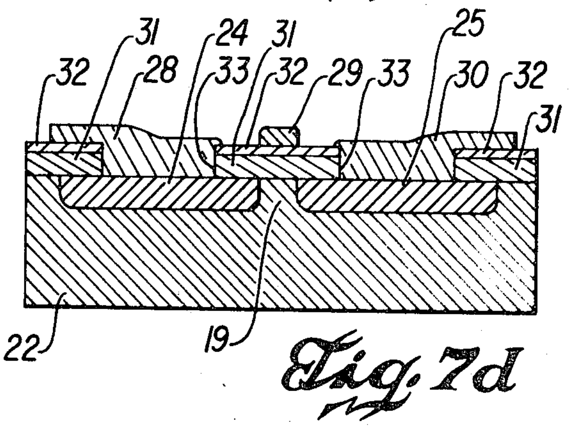

The metal source contact 28, the metal gate electrode 29 and the metal drain contact 30 are formed to complete the MOS-FET as shown in FIG. 7*d*.

Figure 8A:
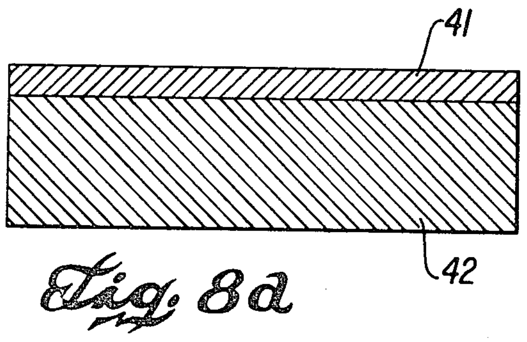
Figure 8B:
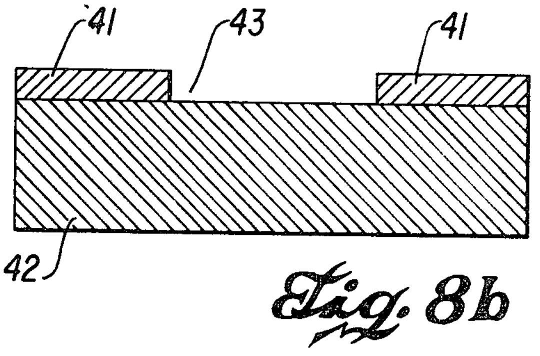

Still another embodiment of the invention is shown in FIGS. 8*a*–8*f* which illustrate the use of the invention in the formation of a bipolar transistor. An insulating layer 41; such as, silicon oxide; is formed on the surface of a silicon substrate 42 by conventional methods, as shown in FIG. 8*a*. An aperture 43 is formed in the layer 41 by conventional photolithographic techniques, as shown in FIG. 8*b*.

Figure 8C:
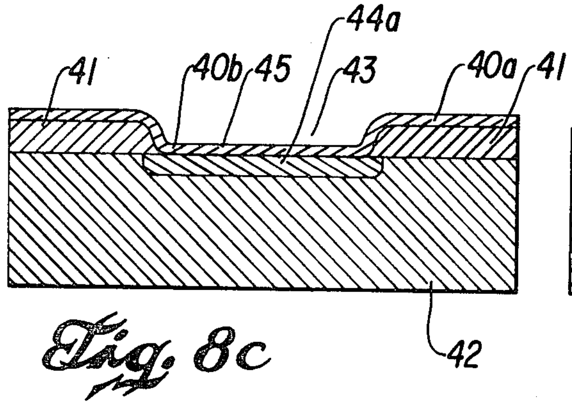
Figure 8D:
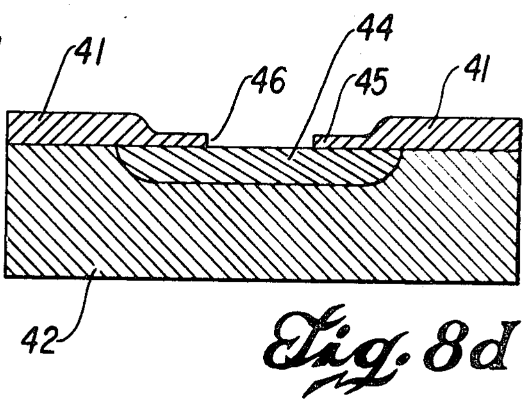

A collector region 44, opposite to that of conductivity-type substrate 42, is formed beneath the aperture 43 by two-step diffusion process, previously described herein and shown in FIGS. 8*c* and 8*d*. After the first step of the diffusion process, a film phosphosilicate glass 40*a* is formed on the surface of the silicon oxide layer 41 and phosphorus glaze 40*b* is formed on the surface of the silicon substrate 42 exposed by the aperture 43. A very thin diffused region 44*a* is formed during the first diffusion step, as shown in FIG. 8*c*. The phosphosilicate glass 40*a* and phosphorus glaze 40*b* are removed by chemical etching.

The substrate 42 is placed in the furnace at about 1,000° C. for a sufficient period of time to further diffuse the phosphorus to a depth sufficient to form the collector region 44. The second diffusion step forms an oxide 45 on the surface of the silicon substrate 42 exposed by the aperture 43. By conventional photolithographic techniques a new aperture 46 is formed in the oxide layer 45, as shown in FIG. 8*d*.

Figure 8E:
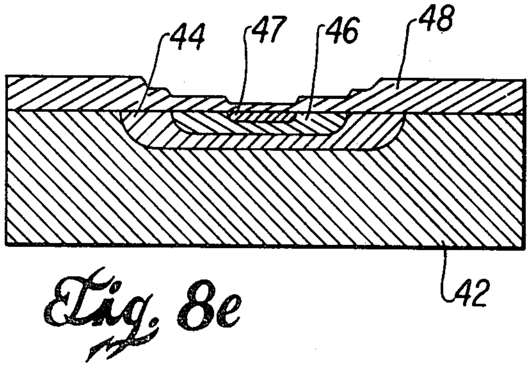

The base and emitter regions are formed in the same manner as the collector region with the resulting glass caused by each diffusion operation being successively removed until the structure, as shown in FIG. 8*e*, is obtained with a collector region 44, a base region 46 and an emitter region 47.

Figure 8F:
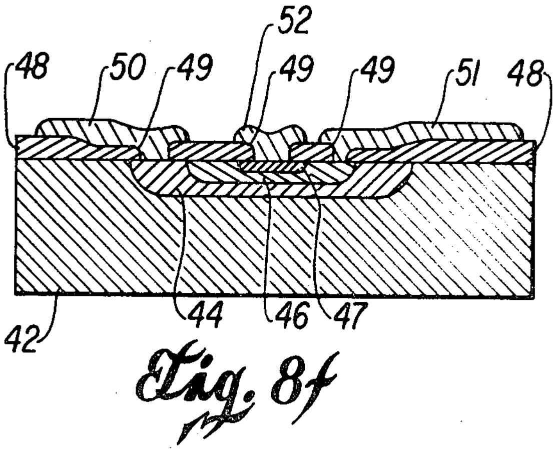

By conventional photolithographic techniques apertures 49 are formed in the oxide layer 48 which is the combination oxide layer resulting after all diffusions have been completed. The metal collector contact 50, the metal base contact 51 and the metal emitter contact 52 are formed making ohmic contacts to the collector region 44, the base region 46 and the emitter region 47, respectively, as shown in FIG. 8*f*.

Figures 9A, 9B:
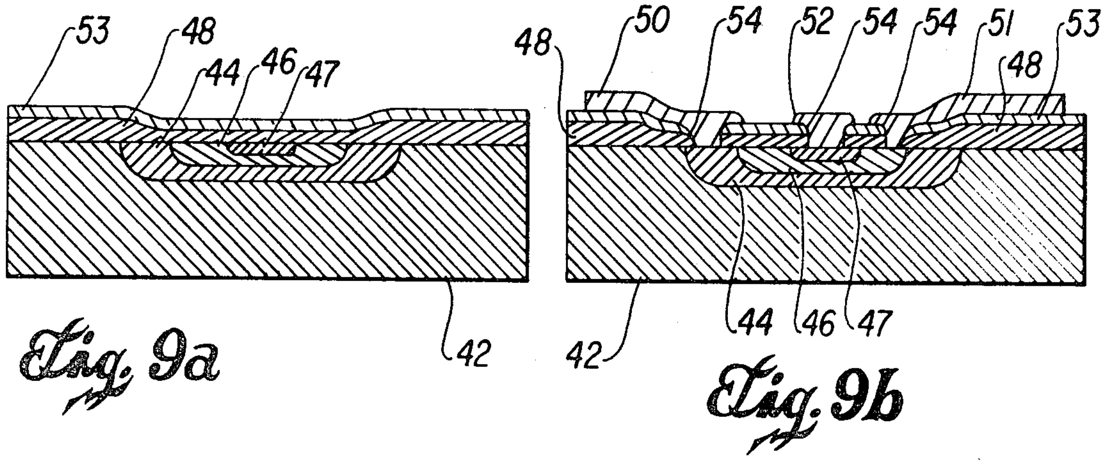

A sodium-barrier layer 53 of silicon nitride or aluminum oxide, for example, can be applied to the substantially uncontaminated silicon oxide layer 48 prior to contact formation, as shown in FIG. 9*a*, if desired, for protection against further contamination. Apertures 54 are formed through both the sodium-barrier layer 53 and the silicon oxide layer 48 using conventional photolithographic methods. The metal collector contact 50, the metal base contact 51 and the metal emitter contact 52 are formed as before as shown in FIG. 9*b*.

Although we have described the invention with a relatively high degree of particularity, it is to be understood that the present disclosure has been made only by way of example. Numerous substitutions of equivalent materials and changes in the details of construction may be resorted to without departing from the spirit and scope of the invention as hereafter claimed.

What is claimed is:

1. In a method of forming a semiconductor device the improvement comprising stabilizing said semiconductor device against subsequent ionic interference by the steps of (a) forming an insulating layer on a surface of the semiconductor substrate of said semiconductor device and (b) selectively removing only a minor outer portion that includes the surface portion of said insulating layer, said minor outer portion containing a major portion of impurities contained in said insulating layer.

2. The method of claim 1 wherein said insulating layer is silicon oxide.

3. The method of claim 1 wherein said removing of said minor outer portion in step (b) is effected by removing 200 A. of the outermost portion of the said insulating layer.

4. The method of claim 1 wherein said removing of said minor outer portion is effected by forming a glass which acts as a getter of said impurities and subsequently removing said glass but leaving in place the major portion of said insulating layer.

5. The method of claim 4 wherein said glass is either phosphosilicate glass or borosilicate glass.

6. The method of claim 1 wherein a barrier layer is formed on the surface of the remainder of said insulating layer resulting after the removal of said minor outer portion, said barrier layer being of a material which prevents further contamination of said insulating layer.

7. The method of claim 6 wherein said barrier layer is either silicon nitride, aluminum oxide, phosphorus-doped silicon oxide, or calcium-doped silicon oxide.

8. A method of forming an essentially sodium-free insulating coating for a semiconductor device comprising the steps of: forming an insulating layer on the surface of a semiconductor substrate, depositing an impurity material on the surface of said insulating layer, heating said insulating layer and said impurity for a period of time sufficient to cause said impurity material to react selectively with a portion of said insulating layer to form a glass, and selectively removing said glass, while leaving a substantial portion of said insulating layer, whereby a substantial portion of said sodium present in said insulating layer is removed.

9. The method of claim 8 including the steps of forming a sodium-barrier layer on the surface of the said insulating layer, resulting from the removal of said glass, said sodium-barrier layer being of a material which prevents further sodium contamination of said insulating layer.

10. The method of claim 8 wherein said impurity material is either phosphorus or boron.

11. The method of claim 9 where said sodium-barrier layer is either silicon nitride, aluminum oxide or phosphorus-doped silicon oxide.

12. The method of claim 8 wherein said insulating layer is silicon oxide.

* * * * *